(12) United States Patent
Kydd

(10) Patent No.: US 6,743,319 B2
(45) Date of Patent: Jun. 1, 2004

(54) ADHESIVELESS TRANSFER LAMINATION METHOD AND MATERIALS FOR PRODUCING ELECTRONIC CIRCUITS

(75) Inventor: Paul H. Kydd, Lawrenceville, NJ (US)

(73) Assignee: Paralec Inc., Rocky Hill, NJ (US)

( * ) Notice: Subject to any disclaimer, the term of this patent is extended or adjusted under 35 U.S.C. 154(b) by 0 days.

(21) Appl. No.: 10/265,513

(22) Filed: Oct. 4, 2002

(65) Prior Publication Data

US 2003/0070747 A1 Apr. 17, 2003

Related U.S. Application Data

(63) Continuation-in-part of application No. 09/458,929, filed on Dec. 10, 1999, now abandoned, and a continuation-in-part of application No. PCT/US98/20420, filed on Sep. 30, 1998, and a continuation-in-part of application No. 09/367,783, filed as application No. PCT/US97/16226 on Sep. 12, 1997.

(60) Provisional application No. 60/111,947, filed on Dec. 12, 1998, and provisional application No. 60/153,783, filed on Sep. 14, 1999.

(51) Int. Cl.[7] .................. B65C 1/165; B32B 31/20; B32B 33/00; B05D 5/12; H05K 1/09

(52) U.S. Cl. .............. 156/230; 156/233; 156/240; 156/247; 156/277; 156/289; 156/273.3; 427/96; 427/148; 428/201; 428/202; 428/208; 428/914; 174/257

(58) Field of Search ................. 156/230, 231, 156/233, 238, 240, 241, 242, 247, 277, 289, 272.2, 273.3; 428/195, 200, 201, 262, 204, 208, 209, 211, 914, 915, 202; 427/146, 147, 148, 96; 174/250, 256, 257

(56) References Cited

U.S. PATENT DOCUMENTS

| | | | | |
|---|---|---|---|---|
| 3,313,632 A | * | 4/1967 | Langley et al. | 106/1 |
| 4,572,843 A | * | 2/1986 | Saito et al. | 427/53.1 |
| 4,689,111 A | * | 8/1987 | Chan et al. | 156/643 |
| 4,775,439 A | * | 10/1988 | Seeger, Jr. et al. | 156/231 |
| 5,045,141 A | * | 9/1991 | Salensky et al. | 156/240 |
| 5,059,242 A | * | 10/1991 | Firmstone et al. | 106/1.23 |
| 5,312,480 A | * | 5/1994 | Lotze et al. | 106/1.13 |
| 5,407,511 A | * | 4/1995 | Nakatani et al. | 156/230 |
| 5,948,199 A | * | 9/1999 | McGrew | 156/231 |

* cited by examiner

Primary Examiner—J. A. Lorengo
(74) Attorney, Agent, or Firm—Synnestvedt, Lechner & Woodbridge, LLP; Stuart H. Nissim, Esq.

(57) ABSTRACT

An electronic circuit is made by printing a Parmod® composition on a temporary substrate and curing it to produce a pattern of metal conductors. The conductors are laminated to a substrate under heat and pressure to produce a laminate with the metal prepatterned into the desired circuit configuration. The conductor can also be coated with a polymer and cured to form a prepatterned substrate. Single and double-sided circuits or multilayers can be made this way.

15 Claims, No Drawings

ADHESIVELESS TRANSFER LAMINATION METHOD AND MATERIALS FOR PRODUCING ELECTRONIC CIRCUITS

CROSS REFERENCE TO RELATED APPLICATIONS

This application is a continuation-in-part application of U.S. patent application Ser. No. 09/458,929 filed on Dec. 10, 1999, now abandoned, the entire contents of which is hereby incorporated by reference, which was based upon U.S. Provisional Patent Applications No. 60/111,947 flied on Dec. 12, 1998 and No. 60/153,783 flied on Sep. 14, 1999, and was a continuation-in-part application of PCT/US98/20420 filed on Sep. 30, 1998 and of U.S. patent application Ser. No. 09/367,783 filed on Aug. 20, 1999, now U.S. Pat. No. 6,379,745 issued on Apr. 30, 2002 which was a National Stage filing of PCT/US97/16226 filed on Sep. 12, 1997.

BACKGROUND OF THE INVENTION

In the microelectronics industry the basic method for forming circuit traces on a substrate involves a combination of photoresist and electroplating steps, which incorporate many hazardous and expensive compounds and solvents, and involves extensive processing of the circuit board/substrate. One method used to avoid the repeated processing of the substrate involves forming the circuit traces on a metallic board using the photoresist/electroplating processes or by die cutting the circuit patterns from a metal foil. An adhesive is then used to transfer the circuit to the substrate by transfer lamination. Another alternative is the "lift off" method. In this process an adhesive image of the circuit traces is formed on the substrate. A metal foil is then bonded to the adhesive image and the unwanted foil not bound to the adhesive image is then lifted off by an adhesive film. It would be desirable to eliminate the use of photoresist and electroplating steps and the need for an adhesive in a transfer lamination process.

There is substantial literature relating to transfer lamination of patterned circuits from one substrate to another. For example, Seeger, Jr. (U.S. Pat. No. 4,75,439) discloses "applying a slurry of a vaporizable solvent, metal particles and a small amount of binder in the shape of the circuit pattern desired to a removable layer, vaporizing the solvent, covering the powdered metal and binder with an adhesive to hold the powdered metal and carrier in place on the removable layer, laminating the hydrocarbon containing substrate with pressure and heat to cause compacting of said powder and bonding of said compacted powder to said substrate by adhesive layer(sic), said heat being insufficient to destroy said adhesive, substrate and removable layer, and separation of the removable layer." Seeger, Jr., discloses that the adhesive is essential not only to bond the finished circuit to the final substrate but also to bond the metal particles together.

Seeger, Jr. discloses, "A metal slurry of metal particles, e.g. noble metals such as silver, palladium, gold and platinum, is preferably mixed with the combination of other metal particles such as nickel or tin. A vaporizable solvent is mixed therewith as well as a small amount of a curable plastic binder." (Seeger, Jr. column 2, lines 15–20). A particular mixture is given as an example in Seeger, Jr. column 4, lines 8–18. These mixtures are very similar to mixtures known as "Ormet" and are described in Capote et al, U.S. Pat. Nos. 5,538,789 and 5,565,267, among others. The mixtures are described by Ormet Corp. (formerly Toronaga Technologies) as "Transient Liquid Phase" materials in that they function by heating the combination of high melting point and low melting point metal powders in a fluxing environment to the eutectic temperature at which the powders alloy and freeze again to form a continuous conductor. The mixture also includes an epoxy resin, which cures at the eutectic temperature and acts as a binder to fill the porosity between the metal particles and to adhere them to the substrate.

The mixtures of Seeger, Jr. also resemble conventional polymer thick film (PTF) mixtures of metal powders and epoxy or other polymer binders available from Acheson, DuPont and many other vendors, with the addition of the low melting tin powder. Polymer thick film materials are cured at approximately 150° C. for times ranging from a few minutes to an hour. The result is a conductor in which the epoxy binder is the continuous phase and electrical conductivity results from adventitious contact between metal particles. The conductivity typically is less than ten percent of the conductivity of bulk metal, usually much less, and is somewhat subject to changes with age and environmental stress. The traces are not solderable because of the epoxy. However, the cure conditions are compatible with most polymer substrates, and so there is no incentive to perform transfer lamination. Virtually all computer keyboards and other membrane touch switches are now typically made by printing PTF materials directly on polyester substrates.

Ormet type Transient Liquid Phase mixtures cure to metal traces in which the metal is the continuous phase and the epoxy binder fills the interstices. Electrical conductivity is substantially better than most PTF materials, but still only 10% of bulk metal because the material is an alloy as well as being porous. Lack of solderability is still a problem because of the epoxy binder, but the electrical performance is better than PTF, and there is an incentive to do transfer lamination because the Ormet cure temperature of 220° C. is well above the 125° C. to which polyester substrates typically are limited. Seeger, Jr's stated cure temperature of 177° C. (350° F., column 2, lines 33–43) is lower than quoted by Ormet, and will result in poorer metallurgical properties, but will still require transfer lamination.

A novel family of materials has been developed for printing on polymer substrates such as those used for printed wiring boards and flexible circuits. These compositions have been used to produce metal traces utilized in a transfer laminate process. They offer the advantage over polymer thick films, Ormet materials, and the like, by producing electrical conductors consisting of a pure, single-phase metal can be produced by a simple print-and-heat process instead of by the usual multi-step photolithographic etching process. This family of novel compounds is commercially available as Parmod® compositions from Parelec, LLC, Rocky Hill, N.J., USA, and are described in U.S. Pat. Nos. 5,882,722 and 6,036,889 (the total disclosure and contents of each patent being hereby incorporated by reference); as well as in co-pending PCT patent application WO98/37133 and in Applicants' co-pending U.S. application Ser. No. 09/367,783 filed Aug. 20, 1999 (the total disclosure in its entirety of each application being hereby incorporated by reference). These compositions can be formulated for use in a printing process, for example as inks, pastes, toners, etc. These formulations can be printed on a substrate and cured at a temperature below 450° C. to well-consolidated films or traces of pure metal in seconds. The fast curing capability of these Parmod® compositions, as well as their easy application, makes it possible to use them to create complex thin metal objects by very simple and low-cost processes. An example of such an object is a pattern of electrical conductors used as an antenna in a radio frequency identification tag. Another such application is as a TAB bonding decal for semiconductors. Electronic circuit patterns of many types can be produced by this process and bonded to various types of substrates and devices. The method can be used to produce strain gauges, thermocouples and other types of instrumentation. Many other such objects and applications will be evident to those skilled in the art.

These Parmod® compositions include printable inks and pastes, which comprise metal flakes and/or powders mixed with a Reactive Organic Medium (ROM). The compositions are printed on a substrate and heated. This decomposes the ROM, which chemically welds the particulate constituents together, and the residual organic material leaves as vapor. The result is a pure metallic deposit which can function as an electrical conductor with low resistivity and which is solderable. This capability is unique relative to all other options for printable electronics.

In contrast to the mixtures described in Seeger, Jr., the Parmod® compositions cure to a pure, single-phase metal trace with no organic content. This is demonstrated in FIG. 4 of U.S. Pat. No. 5,882,722 for example. The cure temperature of these mixtures is typically 200–300° C., which definitely requires transfer lamination to apply them to many polymer substrates, specifically polyester. The result, however, is a vastly superior product with electrical conductivity between 25 and 50% of that of bulk metal. Copper traces prepared from these mixtures are perfectly solderable because there is no residual organic content. The organic and metallo-organic constituents of the reactive organic medium of the present invention are chosen to be thermally labile and to volatilize completely at the cure temperature.

Other adhesive-based transfer processes have been described in the patent literature. Salensky (U.S. Pat. No. 5,045,141) summarizes the literature on prior transfer processes (column 5, line 35 to column 6, line 28). His invention is a specific thixotropic conductive ink, and an adhesive to apply it, used in a specific inventive transfer process (flow chart shown in column 6, lines 45–57). Levesoue and Harper (U.S. Pat. No. 3,703,603) describe conductors similar to those of Seeger Jr. in that the "metallic particles are intermixed with an appropriate adhesive" (column 1 lines 43–47). The adhesive is critical to the bonding of the particles together and to the transfer from the carrier strip to the final circuit board. The transfer is accomplished by rubbing or burnishing, which generates sufficient heat and pressure to bond the circuit element to the board and to release it from the carrier strip, as described in claims 1 and 2. This is similar to many transfer materials for applying lettering, for example, which are consist of a sheet of patterns coated with a pressure sensitive adhesive which can be transferred to a final substrate by burnishing.

The patent of Nakatani (U.S. Pat. No. 5,407,511) discloses the curing of conventional thick film pastes at required temperatures in the range 600–1000° C. as recited in his claims 1, 3 and 6. As noted previously, Parmod® mixtures can be cured at temperatures below 450° C. Also, Nakatani specifically refers to the use of an adhesive layer denoted 103 in his FIG. 1 and in column 6 line 29 where "a polyimide sheet with an epoxy adhesive (available from Toray Industries, Inc.)" is cited in example 1 and by inference in the subsequent examples.

It has been discovered that Parmod® compositions can be transferred and bonded to a substrate without the use of a separate adhesive coating or layer. Utilizing the unexpected bonding properties of the Parmod® compositions, solderable, high conductivity metal objects, e.g., traces, can be bonded to a broad range of substrates, saving the costs and extra steps of using an adhesive.

Using the Parmod® compositions result in a pure metallic deposit which can function as an electrical conductor with low resistivity and which is solderable. This capability is unique relative to all other options for printable electronics. In direct comparisons, Parmod®-based compositions and the resulting traces are superior to those used by Seeger, Jr., Salensky, Nalatani, and Levesoue and Harper. And all of the art currently require the use of a separate adhesive to bond the circuit trace to the substrate—where none is needed when using Parmod® compositions.

BRIEF SUMMARY OF THE INVENTION

The present application describes a method of transfer lamination, which does not use an adhesive. The present invention decouples the curing and adhesion processes from the substrate by doing the printing and curing on a temporary substrate and then transferring the metal object produced to a permanent substrate at low temperature without the use of an adhesive utilizing metal objects produced using ROM-metal compositions, such as, Parmod® compositions. It is preferred that the temporary substrate: have approximately the same coefficient of thermal expansion as the Parmod®; that it withstand the temperature at which the Parmod® cures; that the Parmod® not permanently bond to it; and, that it be easily reusable or very inexpensive. The permanent substrate must have the ability to bond to the printed and cured metal In one embodiment a polymer-based substrate is built up on the cured circuit traces and cured in place, rather than being produced as a separate laminate or film. In another embodiment the cured circuit traces are laminated under heat and pressure to a premade substrate which can soften and flow into the pores of the Parmod® traces, thus eliminating the need for a separate adhesive layer or coating. These methods simplify the process and lower costs by using the substrate itself as the adhesive in the lamination process.

DETAILED DESCRIPTION OF THE INVENTION

Preferred compositions useful for forming the traces, components and objects of this invention are ROM-metal mixtures described in detail below. These compositions can be applied to thermally stable substrates and cured to well-consolidated circuit traces and objects by heat treatment. The compositions exhibit a critical temperature above which they undergo a transformation to well-consolidated electrical conductors with a resistivity only two to four times the bulk resistivity of the metal in question. The electrical conductivity is equal to that obtained by conventional high temperature metal powder sintering in conventional thick film compositions on ceramic substrates. Remarkably, this consolidation process takes place at temperatures 400 to 500 degrees Celsius lower than with compounds conventionally used in thick film technology, and in times which are an order of magnitude shorter than are required for sintering.
Parmod Compositions and Their Characteristics Parmod® compounds contain a Reactive Organic Medium (ROM) and a source of metal, preferably metal flakes, metal powders and their mixtures. The ROM consists of either a Metallo-Organic Decomposition (MOD) compound or an organic reagent, which can form such a compound upon heating in the presence of the metal constituents. The ingredients are blended together with organic vehicles and with rheology modifying organic vehicles if necessary, to produce printing inks or pastes or toners for electrostatic printing. These inks and toners can be printed on a temperature-sensitive substrate and cured to well-consolidated, well-bonded electrical conductors at a temperature low enough so that the substrate is not damaged. The curing process occurs in seconds at temperatures as much as 500° C. below those used for conventional sintering of thick film inks and pastes. The process can be performed continuously, for example, using belts and tapes or webs. Likewise, using a series of belts, tapes and webs, multilayered units can be produced.

Suitable metals include copper, silver, gold, zinc, cadmium, palladium, iridium, ruthenium, osmium, rhodium, platinum, iron, cobalt, nickel, indium, tin, antimony, lead, bismuth and mixtures thereof.

In a preferred embodiment, the metal mixture contains micron-size metal flake or powder and colloidal or semi-colloidal metal powder where the total of metal (flake plus powder) is preferred to be 80–95% of the total mixture, and the colloidal powder is preferred to be 10–40% of the total metal. Larger amounts of organic vehicle may be added to reduce viscosity for certain applications.

The metal flakes have a major dimension between 2 to 10 micrometers, preferably about 5 micrometers, and a thickness of less than 1 micrometer. They can be produced by techniques well known in the art by milling the corresponding metal powder with a lubricant, which is frequently a fatty acid or fatty acid soap. The micron-size starting powders are usually produced by chemical precipitation to obtain the desired particle size and degree of purity. They can be advantageously used without milling in certain compositions. The flakes are sold for electronic applications as constituents of thick film inks and silver-loaded conductive epoxies.

The flakes or micron-size powders perform several functions. They form a skeleton structure in the printed image which holds the other ingredients together and prevents loss of resolution when the mixture is heated to cure it. They also provide good electrical conductivity in the finished trace. The flakes naturally assume a lamellar structure like a stone wall, which provides electrical conductivity in the direction parallel to the surface of the substrate and provides a framework to lessen the amount of metal transport necessary to achieve well-consolidated pure metal conductors. They also provide low surface energy, flat surfaces to which the other constituents of the composition can bond.

The other metallic powder mixture constituents of the present invention are preferably colloidal or semi-colloidal powders with individual particle diameters below about 100 nanometers, preferably less than about 60 nanometers. A primary function of these powders is to lower the temperature at which the compositions will consolidate to nearly solid pure metal conductors. The presence of fine metal powder has been found to be helpful in advancing this low temperature process with silver and essential to the consolidation of copper mixtures. It is important that they be present as individual particles. Metal particles this small have a strong tendency to agglomerate into aggregates with an open skeletal structure.

Colloidal silver particles with a nominal diameter of 20 nanometers have been shown to have an excellent state of dispersion and have been used in silver compositions and lowered the critical consolidation temperature from 300 to 260 degrees C.

To achieve and preserve the desired degree of dispersion of colloidal metal it is essential to stabilize the particles so that they cannot aggregate. In the case of the silver particles they were stabilized by the presence of a surfactant that coated the surface of the particles and prevented metal-to-metal contact. Suitable surfactants include carboxylic acids and metal soaps of carboxylic acids. This favors chemical precipitation as a means of producing the powders, since they can be exposed to an environment that promotes stabilization from formation to final consolidation.

The Reactive Organic Medium (ROM) provides the environment in which the metal mixture is bonded together to form well-consolidated conductors. Many classes of organic compounds can function as the ROM. The common characteristic, which they share and which renders them effective, is that they have, or can form, a bond to the metal via a heteroatom. The heteroatoms can be oxygen, nitrogen, sulfur, phosphorous, arsenic, selenium and other nonmetallic elements, preferably oxygen, nitrogen or sulfur. This bond is weaker than the bonds holding the organic moiety together, and can be thermally broken to deposit the metal. In most cases the reaction is reversible, so that the acid or other organic residue can react with metal to reform the metallo-organic compound, as shown schematically below:

I) R–M⇌R+M where R is a reactive organic compound and M is the metal.

As an illustration of Parmod® mixtures containing MOD forming constituents such as organic acids, the reactions that take place in curing are as follows:

IIa.) Acid+Metal powder⇒MOD+$H_2$ or

IIb) Acid+Metal Oxide⇒MOD+$H_2O$ and

III) MOD+heat+$H_2O$⇌Bulk metal+Acid

The effect is to consume the small particles and weld together the big ones to create macroscopic circuit conductors of pure metal. In place of acid, some other active organic reagent which will produce an easily decomposed metallo-organic compound from either the oxide or the metal could be used. An example would be the use of sulfur compounds to make mercaptides or nitrogen ligands to produce decomposable complexes.

Examples of useful compounds are soaps of carboxylic acids, in which the hetero-atom is oxygen; amino compounds, in which the hetero-atom is nitrogen; and mercapto compounds, in which the hetero-atom is sulfur.

Specific examples of preferred ROM constituents are the carboxylic acids and the corresponding metallic soaps of neodecanoic acid and 2-ethyl hexanoic acid with silver and copper, such as silver neodecanoate:

$AgC_{10}H_{20}O_2$ and silver 2-ethyl hexanoate:

$AgC_8H_{16}O_2$

Gold amine 2-ethyl hexanoate is an example of a nitrogen compound:

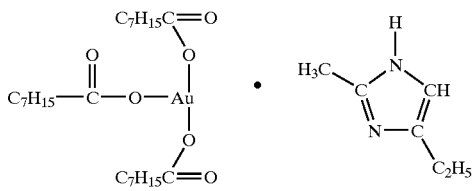

Gold Amine 2-Ethyl Hexanoate (Gold Amine Octoate)

Gold t-dodecyl mercaptide is an example of a sulfur compound:

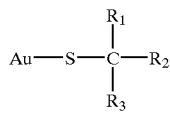

where $R_1$, $R_2$, and $R_3$ total $C_{11}H_{23}$

These ROM compositions can be made by methods well known in the art. All of the above compounds are capable of decomposition to the respective metals at relatively low temperatures. For the silver neodecanoate and silver 2-ethyl hexanoate (silver octoate), the decomposition temperature is between 200 and 250° C. For the corresponding copper compounds, it is between 300 and 315 C. Gold sulfides decompose at very low temperatures in the neighborhood of 150° C. Gold amine octoate decomposes between 300 and 500° C. The copper and silver compounds can be reformed from the corresponding acids at the same temperature, so the reaction is reversible, as mentioned above.

In some cases it is convenient to add rheology-enhancing compounds well known in the art to improve the printing characteristics of the compositions of the invention. Alpha-terpineol has been used to reduce the viscosity of copper and silver compositions to facilitate screen-printing. Alpha-terpineol also participates in the consolidation reaction by virtue of the acid character of the OH group bonded to an unsaturated ring. By selecting constituents and additives, it has proven possible to produce a range of printable compositions ranging from fluid inks with a viscosity of 15 centipoise to solid powders.

Parmod® mixtures function by deposition of material from decomposition of the MOD compound which "chemically welds" the powder constituents of the mixture together into a monolithic solid. In the case of metals, this results in a porous but continuous metal trace which has a density approximately half that of bulk metal and an electrical conductivity per unit mass which is also approximately half that of the bulk metal. This demonstrates that the printed Parmod® conductors are made up of continuous well-bonded metal rather than of individual particles that are in adventitious contact with each other, as in so-called polymer thick film materials. SEM cross sections of copper, silver and gold mixtures that have been heated above the critical temperature show that the metal flake and powder have consolidated into a bonded network of solid metal.

The composition is printed on the substrate using any convenient printing technology. Screen printing and stenciling are suitable for rigid substrates in relatively small numbers with high resolution. Gravure printing, impression printing and offset printing are suitable for high production rates on flexible substrates. Ink jet printing and electrostatic printing offer the additional advantage of direct computer control of the printed image. Examples of Electrostatic Printing are disclosed in Applicant's co-pending application Ser. No. 09/369,571 filed on Aug. 6, 1999. This permits circuits to be printed directly from Computer Aided Design (CAD) files and eliminates the need for special tooling. Each circuit can be different, if desired, for coding or prototyping. The same end can be achieved at lower production rates with computer-controlled dispensing equipment. This equipment produces dots or lines by moving a needle over the surface and dispensing printing composition supplied by a pump or pressurized syringe.

Compositions of this invention have been applied by screen printing, stenciling, dispensing, gravure printing, ink jet printing, impression printing, offset printing and electrostatic printing. Alternative application methods include coating an adhesive pattern with a dry powder composition or toner. Screening, as used in applying conventional thick film pastes has been used most extensively for preparing samples for evaluation. A composition with a viscosity of approximately 500 poise is forced through a fine screen with a photo-defined open image of the desired conductor pattern in it by a rubber squeegee. The resolution that has been achieved by this method is approximately 125-micron (5 mil) lines and spaces, although production screen printers can achieve patterns as fine as 50 microns. Conductive traces with thicknesses up to 50 microns have been printed, though most of the test patterns have been in the neighborhood of 12 microns thick, which is equivalent to 0.37 ounces of copper per square foot.

Both gold and silver mixtures can be heated in air since the elemental metals are the stable form at the temperature at which the metallo-organic constituent decomposes. Copper, however, requires the use of a protective atmosphere to prevent the formation of copper oxide that is the stable product of decomposition in air. A nitrogen atmosphere containing less than about 20 and most preferably less than 3 ppm by volume of oxygen has been found to be suitable. Addition of water vapor in the amount of about 5% has proven to be helpful in improving the conductivity of the resulting deposits.

Copper and silver Parmod® compositions have been directly printed on polyimide films coated with various adhesive layers and thermally cured to create well-bonded flexible printed circuits. Suitable substrates are DuPont Kapton type FN with a FEP Teflon coating and types KJ and LJ with low melting polyimide coatings. Copper Parmod® compositions have been printed on rigid polyimide-glass laminates coated with a low melting polyimide adhesive and thermally cured to create rigid printed circuits.

Transfer Lamination

To broaden the number of types of substrates which can be employed, copper and silver Parmod® compositions have been printed on temporary substrates, thermally cured, and transfer laminated to a number of polymers including rigid polyester-glass and epoxy-glass laminates using an acrylic adhesive film. The transfer lamination process has the advantage of separating the thermal cure process for converting the Parmod® mixture into well-consolidated pure metallic conductor traces from the adhesion process for bonding the traces to the polymer-based substrate. This broadens the choice of substrates and adhesives and allows for more flexibility in process conditions to optimize the two functions independently. The use of a separate adhesive coating or film is undesirable because it increases the cost of the final circuit substantially and it introduced an additional material that may degrade the electrical or thermal performance of the finished circuit. It is highly desirable to use the polymer substrate itself as the adhesive, and that is the objective of this invention.

While the Parmod® should not bond to the thermally stable substrate, a certain amount of tackiness or adhesion may be desired when using an automated, continuous process. Substrates well known in the art will possess the characteristics required for the temporary substrate. Examples of suitable temporary substrates include, but are not limited to, polyimide films, polysulfone films, polyester films, Teflon-coated films, silicone-coated films, metal foils, glass and ceramic surfaces. Teflon-glass laminate fulfills all of the requirements very well and will be used in the examples. This material is available from Taconic Plastics, Petersburg, N.Y., in both rigid and flexible form, suitable for both batchwise and continuous belt processing. It has the advantage that its thermal expansion coefficient matches that of copper, and the substrates to which it is applied, better than unreinforced Teflon does.

The permanent substrate must have the ability to bond reliably to the transferred metal foil in addition to any other requirements of the final application such as dielectric strength. Examples of suitable substrates include, for example, polyethylene, polypropylene, polystyrene, polyester, polycarbonate, polyurethane, polyimide, cellulose and paper.

Conventional Circuit Formation

Epoxy-glass laminates are the most commonly used substrates for electronic circuits. Most such circuits are multilayers in which the circuit traces are etched into copper foil bonded to both sides of thin epoxy-glass laminate cores. The cores are then stacked up on lineup pins with layers of B-stage epoxy-glass prepreg between each layer and bonded under heat and pressure into a solid multilayer laminate structure. The multilayer is drilled, and the holes are metallized by electroless plating to make electrical connections between layers. The outside surfaces are then circuitized by photolithographic patterning and electroplating to complete the circuit board.

The result is a very high quality product but an expensive one. A major fraction of the expense resides in the purchased copper-clad laminate itself. This material is made from copper foil, which is specially treated to have a rough surface that will bond reliably to the epoxy-glass. The foil is laminated to at least two layers of epoxy-saturated glass under pressure in a vacuum autoclave, which is inherently an expensive process. Then, at the circuit board fabricator, the copper is coated with an expensive photosensitive resist. The resist is exposed through a phototool and developed to remove the unexposed material. The copper is then etched away in the unexposed areas, and the resist is stripped from the exposed areas. This process produces very fine circuit traces of well-bonded metal but wastes at least two thirds of the copper and all of the resist that is applied. In addition to the cost of the original materials, there are substantial costs associated with disposing of the hazardous wastes generated as well.

The Novel Process of this Invention

A preferred transfer process of this invention involves printing the circuit traces with Parmod® on one or two panels of Teflon-glass or some other temporary substrate. The Parmod® is printed only where copper is needed, eliminating waste. The panels are lined up with one another with a layer of polymer film, epoxy-glass prepreg or laminate in between and cured in a vacuum autoclave or press to make a structure similar to inner layer laminate. However, instead of having a continuous sheet of metal foil, for example, copper, that must be circuitized, the copper is prepatterned in the desired configuration, eliminating cost and waste. The effect of this process is to move the production of laminate downstream from the material supplier to the circuit board fabricator, using the vacuum autoclave equipment that the fabricator has in place to make the individual cores as well as the finished multilayer.

Parmod® circuit traces are well suited to this process because the metal, while continuous, is porous. As a result of this, the epoxy will infiltrate the porous metal traces and achieve a very rugged bond without further pretreatment of the metal. This infiltration of resin will strengthen the metal traces as well as bonding them to the surface, and dramatically increase their mechanical strength and resistance to temperature cycling.

Yet another advantage of the present process is that the surface of the finished laminate is flush, with the conductors inlaid into the laminate. This facilitates making connections to surface mount components, as well as achieving a uniform lay-up of a multilayer circuit.

It has been found, unexpectedly, that Parmod® circuitry/traces can be laminated to cured ("C stage") epoxy-glass laminate under heat and pressure. The lamination process takes place at temperatures above the glass transition temperature of the epoxy, typically about 145° C. The laminate is rubbery at this temperature and under a pressure of about 450 psi (3.0 Mpa) it flows into the extensive surface porosity of the Parmod® metal trace. Using conventional epoxy prepreg materials in contact with Parmod® traces suffers from the fact that the very fluid "B stage" epoxy, which is designed to flow and coat the very fine microroughness of copper foil, penetrates the entire Parmod® trace and renders it difficult to clean up for contact with subsequent metallization or for soldering. In contrast, the cured resin of the laminate is cross-linked and cannot flow throughout the porous metal, but flows into the surface porosity to make an adequate bond. This bond is enhanced by the fact that the epoxy continues to crosslink and cure when reheated to do the lamination. There is a chemical interaction with the surface as well as physical wetting and interlocking.

An alternative solution to the problem of polymer infiltration into the porous Parmod® metal traces interfering with solderability is to use a resin that does not penetrate the porous metal entirely but will bond with it. Polyester and epoxy resins loaded with particulates to make filling compounds are effective, nonpenetrating permanent substrate materials. Thermoplastic polymer films are also suitable by virtue of their high viscosity.

Other materials exhibit the same ability to soften and adhere to Parmod® circuitry in the lamination process, including for example, paper and cardboard. It is well known that ground wood will bond under heat and pressure to form solid hardboard. Masonite is an example, and there are other such products produced by similar processes. An Example is given below showing that Parmod® silver patterns will adhere to newspaper and low cost boxboard which contain a high proportion of ground wood and low proportion of chemical pulp. The advantage of ground wood in this application is that it still contains the lignin, which is a natural resin adhesive that binds the cellulose fibers together in the tree. Under heat and pressure the lignin will flow and chemically react to bond the fibers together in the new compressed configuration and to bond them to the circuitry. Kraft paper, which uses pulp from which the lignin has been removed chemically, does not bond in this way. Although it is a stronger product, it does not appear to be suitable for transfer lamination without added adhesive.

Because wood is made up of cellulose fibers and crosslinked lignin it does not melt when heated, although it will char in air. Circuits laid up on cardboard can be soldered in an inert atmosphere without significant further damage to the circuit since the lamination process at 220–250° C. has already taken place at a higher temperature than the melting point of eutectic tin lead solder at 183° C.

An alternative method for achieving the objective of making the circuit and the substrate in the same process is to lay up the substrate on a printing plate with the circuit as a raised pattern of lines similar to a letter press or Flexographic plate. The plate would be inked by pressing it onto a Parmod®-coated roller or plate and heated to cure the Parmod® to a weakly adhering metal image. The image could be coated with an epoxy or other resin composition, reinforced with glass cloth if desired, and cured thermally or by UV radiation. The result would be a resin-bonded circuit layer with the circuit lines depressed below the surface. Alternatively, the image could be pressed into the surface of an epoxy glass laminate, a sheet of boxboard or the like under heat and pressure to bond the circuit traces to the substrate. This configuration is desirable in some instances to improve the self-aligning of the components to be soldered to the traces and to improve the strength of the solder joints. The method also provides more reliable separation between closely spaced traces than a planar image because the surface relief provides a longer insulating path for a given line spacing.

The general method of making circuits by transfer lamination can be applied to other systems than conventional FR-4 single, double and multilayers. The characteristic is that the laminate is manufactured in a patterned state. Clearly, various grades of epoxy such as BT epoxy with a high glass transition temperature can be used.

Polyester resin can be substituted for epoxy to create polyester-glass circuits. In this case, glass cloth would be wet down with catalyzed resin as the transfer lay-up is made, rather than using prepreg. This process lends itself to implementation on a continuous belt to produce very large volumes of inexpensive circuitry.

Polyimide-glass prepreg such as Allied Signal P-25 can be used in the present process to produce a very high performance analogue of conventional FR-4 multilayers.

DuPont Thermount spun bonded aramid fiber prepregged with polyimide by Arlon can also be used to make a high quality laminate by the present process.

Flex Circuits

The same technology can be adapted to producing flexible circuitry, which is normally done on a polyimide film substrate. The polyimide is normally laminated to copper foil using an acrylic thermosetting adhesive. The circuit is formed as described above for inner layers. The polyimide laminate is very expensive. While 1-mil polyimide film can be bought for $0.53 per square ft., 1-mil polyimide coated with 1-mil of acrylic adhesive costs $6.04 and the acrylic-coated polyimide bonded to 1 ounce per square ft copper foil costs $10.04. Thinner grades of copper and the so-called self-bonded grades of flex laminate in which the polyimide is cast directly on the roughened copper foil are still more expensive.

The process of this invention can be applied to create double-sided flex circuitry by again printing and curing the circuitry for each side on Teflon-glass with Parmod®. The panels or belt carrying the circuits would be coated with a polyimide film to complete the laminate. Other types of film such as Mylar polyester could also be used with a further reduction in cost. In making single-sided flex circuits the polyimide, polyester or other film can be cast onto the cured circuitry on the Teflon-glass and cured by heat or UV radiation to create the final circuit. This process lends itself to continuous production on a belt for high volumes and low cost.

This process would eliminate the steps of making and treating specially prepared copper foil and laminating it to specially coated polyimide film. The coating would be done as the patterned copper was being laminated, and waste would be eliminated. No separate adhesive film would be required.

For still greater economies and higher production rates, the conductor pattern can be applied to a continuous web of substrate by a rotary press, much like printing a newspaper but with finer resolution. Gravure printing can be used in this application. Offset printing can produce very high resolution also. Ink jet printing and electrostatic printing at high speeds are candidates. Following the printing step, the circuits will be cured in an oven, still as a continuous web. The ability of these mixtures to cure to solid metal in seconds is critical to realizing this concept. Longer processing times would make the oven disproportionately large relative to the press and squander much of the speed advantage of high speed printing. In a continues process the Parmod® compound is printed in the desired patterns onto a belt of the thermally stable substrate. The belt passes through an oven in which the Parmod® is cured and forms solid metal objects. A continuous "tape" of the permanent substrate is contacted with the belt and the metal objects are laminated onto the permanent substrate tape. The tape can then be cut to form individual circuit boards.

Multiple layers can readily be produced by this technology by using, for example, a thermoplastic coverlay that will lift off another set of images. The process may be continued for as many layers as desired to make multilayer circuits by a continuous, low-cost process.

The lift-on process can also be used to make partially supported patterned metal foil objects such as Tape Automated Bonding Decals. The pattern is printed on a nonadhesive material and lifted onto a die cut substrate tape leaving part of the pattern exposed. The result is a tape with fine metal fingers which can be gang bonded to the pads on semiconductor chips. The outer ends of the fingers, which are supported by the tape, can be soldered to a semiconductor package or direct to a printed circuit for chip-on-board mounting.

Other supported, partially supported and unsupported objects can be made by the technology of the present invention as can be appreciated by those skilled in the relevant arts. Examples are:

Instrumentation such as thermocouples and strain gauges

Resistors, capacitors and inductors printed on polymer films

Electric heaters

Circuitry comprising any or all of the above, such as radio frequency tags that can be interrogated remotely for identification of packages and baggage Decorative metallic items such as jewelry and Christmas ornaments

EXAMPLES

The examples described below indicate how the individual constituents of the preferred compositions and the conditions for applying them function to provide the desired result. The examples will serve to further typify the nature of this invention, but should not be construed as a limitation in the scope thereof which scope is defined solely in the appended claims.

Example 1

A silver Parmod® screen ink was prepared as follows: 12.0 grams of Degussa silver flake, 3.0 grams of silver neodecanoate, and 1.35 grams of neodecanoic acid were mixed together using a spatula. The resulting mixture was then milled on a roll mill to give a homogeneous paste.

Images of an eight turn antenna coil and a capacitative plate were screen printed on separate substrates using silver Parmod®. The screen parameters were a 195 mesh screen backed with a 0.7 mil emulsion. The substrates used were 1-mil thick sheets of Kaladex® 2030 polyethylene naphthalate (PEN). The samples were thermally cured by heating to 210° C. in a box furnace with an air atmosphere for 2–5 minutes. The resulting samples were continuous pure silver films with an electrical resistivity of 3.5 μΩ-cm and poor adhesion to the substrate.

The silver films were then transfer laminated to opposite sides of a 1.3 mil thick polyethylene (PE) substrate. The PE substrate was placed over the silver eight-turn antenna coil. The silver capacitative plate was placed face down on the PE and aligned with the silver image below. The sample was then hot pressed with a 220° C. iron. The two PEN film substrates were then carefully peeled away leaving the silver films transferred intact on either side of the PE substrate. After transfer, the electrical resistivity properties remained the same.

Example 2

The procedure of Example 1 was repeated except that only the capacitative plate was screen-printed and thermally cured using the silver screen ink prepared in Example 1. The eight-turn antenna coil was etched aluminum on a 1-mil thick PE substrate. The silver capacitative plate was transfer laminated to the aluminum coil as was done in Example 1 with similar results.

Example 3

The procedure of Example 2 was repeated except that the capacitative plate was printed and thermally cured on a DuPont Kapton® H polyimide film. Similar results were obtained with the transfer lamination.

Example 4

A silver Parmod® ink similar to the one described in example 1 was printed as an RFID antenna coil pattern on newspaper, shirt cardboard and manila envelope stock and cured at a temperature of 250–260° C. in wet nitrogen to minimize charring of the paper. The same ink was printed in the same pattern on Teflon-glass and cured. The coils direct printed on paper had resistances ranging from 3.5 to 23 ohms and the metal was removed from the paper in a tape test indicating poor adhesion. The samples were stacked in such a way that the antenna coils printed on Teflon-glass were transferred to fresh paper and the direct printed samples were pressed into the paper by contact with the back side of the Teflon-glass. The objective was a direct comparison between direct printed samples that had been post treated by heat and pressure and transfer laminated samples exposed to the same heat and pressure. The stack was as follows from the top:
Blanket
Separator
Newspaper
Teflon-glass
Printed newspaper
Separator
Cardboard
Teflon-glass
Printed cardboard
Separator
Manila
Teflon-glass
Printed manila
Separator The stack was pressed with five tons of force on a 24 square inch area (416-psi) and heated to 248° C. in approximately an hour.

The resistance of the patterns after pressing was as follows:

|  | Ohms | Remarks |
| --- | --- | --- |
| Newspaper transferred | 1.9 | badly charred and very fragile |
| Newspaper printed | 2.5 | " |
| Cardboard transferred | 2.0 | Good appearance good adhesion |
| Cardboard printed | 2.5 | Good appearance poor adhesion |
| Manila transferred | Broke up | No adhesion |
| Manila printed | 2.5 | Poor adhesion |

It can be concluded from this that heat and pressure improve the resistivity of all Parmod® silver patterns. Good resistance and adhesion can be achieved with newspaper, but the substrate is too thermally unstable to be useable. Parmod® silver patterns can be transferred to cardboard with good appearance, good adhesion and good electrical properties. This is important in producing RFID antennas on packaging without the need for a separate substrate. Parmod® silver patterns cannot be transferred to manilla suggesting that highly refined papers with minimal residual lignin do not bond well to the printed image.

Example 5

A copper Parmod ® ink was made by blending the following constituents:

| | |
| --- | --- |
| 2 micron Cerac copper powder | 10 g |
| 9 micron Cerac copper powder | 10 g |
| Copper nanopowder with a particle size of approximately 60 nanometers made by chemical precipitation and containing 22% neodecanoic acid | 11.31 g |
| Neodecanoic acid, Exxon Chemical Prime | 1.18 g |
| Alpha-terpineol | 0.99 g |

The blended material was homogenized by roll milling. The ink was printed on Teflon-glass in a pattern specified by a potential user and cured at approximately 300° C. for nine minutes in a nitrogen atmosphere to create a pure copper image.

Epoxy prepeg was laminated to the copper and cured under heat and pressure. The resulting circuit was adhered to the Teflon glass and could not be removed. Also the porous Parmod® copper was impregnated by the fluid B-stage epoxy and was not solderable after lamination.

This problem was cured by the use of a filled paste type epoxy of the type used as a filler and hole plugging marketed as PC-7 by Protective Coating Co., Allentown, Pa. The filled epoxy adhered to the copper without infiltrating it and separated from the Teflon glass. The resulting circuit soldered very well. The circuit could be reinforced by bonding to a precured epoxy-glass laminate, by bonding to an epoxy glass prepreg or by laying up glass cloth and resin on the filled epoxy, either before or after curing the filled epoxy.

Example 6

A Parmod® copper mixture similar to that in Example 5 was printed on Teflon-glass and cured in a nitrogen atmosphere at temperatures up to 351° C. for 16 minutes. The printed Parmod® copper circuit on Teflon-glass was laminated to 0.62 inch thick G-10 epoxy-glass laminate from McMaster Carr Supply Co. The lamination conditions were temperatures up to 323° C. in an hour with vacuum to improve contact between the film and the printed metal. The pressure was approximately 500 psi. While the conditions were extreme for epoxy and the circuit was extensively blackened, surprisingly the circuit was solderable and survived a solder dip test. Subsequent laminations at 230° C. yielded much better looking circuits on G-10 which could survive a 10 second dip in solder at 245–250° C. The tests were extended to thinner 0.31 thick G-10 and to 0.004 inch thick inner layer laminate from Allied Signal. The Parmod® was printed on aluminum as well as Teflon-glass.

Example 7

The same mixture as used in Example 5 was used to print and cure copper circuit traces on Teflon-glass. The circuits were transferred to polyester resin coated polyester glass laminates. Again the resin either infiltrated the copper, or if allowed to cure, would not bond to it. There was a very narrow range of resin viscosity that produced acceptable results.
A filled polyester, Formula 27 from Evercoat Division of Illinois Tool works, Cincinnati, Ohio, was successfully used to coat the circuit traces without infiltrating them. The coated traces were laminated to premade polyester glass laminate to make customer samples for consumer electronics. They were also used as the base on which to build up a polyester-glass laminate. In both cases the circuits could be separated from the Teflon-glass and were solderable.

Example 8

The mixture of Example 5 was used to coat the raised portion of a nickel printing plate with a pattern of conductors as raised lines. The raised lines was coated with the copper Parmod® mixture by spreading a thin layer of the mixture on a glass plate and carefully contacting the nickel foil with the coating to transfer the mixture to the raised portions of the nickel without coating the nickel between the lines. The sample was cured in a wet nitrogen atmosphere in the usual way to produce a loosely adhering patterned copper coating. This coating could then be transferred to a filled epoxy substrate which is cured in contact with the nickel and stripped off following cure by the method developed by Dimensional Circuits of San Diego, Calif.

Example 9

A Parmod® copper mixture similar to that in Example 5 was printed on Teflon-glass and cured in a nitrogen atmosphere at temperatures up to 351° C. for 16 minutes. The sample was laminated to an 0.8 mil thick film of polyimide resin designated LARC-SI procured from PAR Technologies, Newport News, Va., in the same stack as the epoxy-glass laminate in Example 5. The resin is a soluble polyimide developed by NASA Langley Research Center. The film was cast from a saturated solution of the resin in n-methyl pyrolidinone. The lamination was performed at temperatures up to 323° C. in an hour with vacuum to improve contact between the film and the printed metal. The pressure was approximately 500 psi.
The printed circuit transferred to the polyimide film but did not separate well from the Teflon glass due to its fragility. The experiment was repeated with other LARC-SI films with better results. The transferred circuits could be soldered and would withstand a solder dip test of 20 seconds at 240° C. without delaminating.
A similar experiment with General Electric Ultem polyetherimide film yielded well-bonded circuits of bright copper.

Example 10

It is possible to produce flexible circuits by printing or casting soluble polyimide onto cured Parmod® circuits followed by curing the resin. In this way the dielectric as well as the metal circuitry is produced by an additive technique thereby saving substantial waste of an expensive raw material. Matrimid polyimide from Ciba Geigy was dissolved in gamma butyrolactone to make a solution containing 15% by weight of the polymer which was cast onto a cured Parmod® copper circuit on Teflon-glass and heat treated to dry and cure the resin. The film and the copper were stripped from the temporary substrate and dipped in molten solder. The circuit was solderable, but the film tended to shrink and wrinkle. Similar results were obtained with Probimid polyimide from Olin Chemicals and with LARC-SI Example 11

An improved method was demonstrated by casting a film of LARC-SI onto an aluminum sheet and soft baking it to remove the NMP solvent. The circuit was then printed on the film with a Parmod® copper mixture similar to that described in Example 5, and the copper and the LARC-SI were cured together at 300° C. in wet nitrogen as required by the copper. The circuit could then be overprinted with one or more layers of Espanex soluble polyimide from Nippon Steel Co as a coverlay and cured again under the conditions specified for Espanex. The result was a relatively robust, solderable flexible circuit with all of the dielectric film applied additiviely to lower cost and eliminate waste While the invention has been described with reference to preferred embodiments thereof, it will be appreciated by those of ordinary skill in the art that modifications can be make to the structure and form of the invention without departing from the spirit and scope thereof.

What is claimed:

1. A method for producing one or more patterned metal objects on a substrate comprising the steps of:
   a) applying a metal composition on a thermally resistant temporary substrate in the patterns of the one or more patterned metal objects;
   b) curing said metal composition at a temperature below about 450° C. for a time less than about 30 minutes to form the one or more patterned metal objects;
   c) transferring the one or more patterned metal objects from said temporary substrate to one side of the substrate without the use of a separately supplied adhesive
   wherein said metal composition is comprised of one or more metal powders in a reactive organic medium, said reactive organic medium consisting of one or more components selected from the group consisting of metallo-organic compounds which can decompose into elemental metal and volatile organic fragments, reagents which can react with said one or more metal powders to form metallo-organic compounds which can decompose into elemental metal and volatile organic fragments, and mixtures thereof.

2. The method of claim 1 wherein in transferring step c) said one or more patterned metal objects are directly transferred to said substrate by the application of heat and pressure.

3. The method of claim 2, wherein said substrate is a cured substrate.

4. The method of claim 1 wherein said transferring step c) comprises placing one or more layers of a substrate precursor in contact with said one or more patterned metal objects on said temporary substrate and then curing said substrate precursor in place to form the substrate having said one or more patterned metal objects incorporated therein.

5. The method of claim 1 further comprising the steps of:

d) applying a metal composition on a second thermally resistant substrate in the patterns of additional one or more patterned metal objects;

e) curing said metal composition at a temperature below about 450° C. for a time less than about 30 minutes to form said additional one or more patterned metal objects;

f) Transferring said additional one or more patterned metal objects from said second temporary substrate to the side of the substrate opposite to which said one or more patterned metal objects were transferred in step c).

6. The method of claim 1 wherein said metal composition is applied to said temporary substrate using a method selected from the group consisting of screen printing, stenciling, dispensing, gravure printing, ink jet printing, impression printing, offset printing and electrostatic printing.

7. The method of claim 1, wherein said temporary substrate is in the form of a continuous belt.

8. The method of claim 1 wherein said temporary substrate is selected from the group consisting of polyimide films, polysulfone films, polyester films, Teflon-coated films, silicone-coated films, Teflon-glass laminates, Polyimide-glass laminates, Aramid fiber laminates, metal foils and sheets, glass plates and ceramic bodies.

9. The method of claim 1 wherein substrate is selected from the group consisting of polyethylene, polypropylene, polystyrene, polyester, polycarbonate, polyurethane, polyimide, cellulose, paper, cardboard, epoxy laminates, polyester laminates and polyimide laminates.

10. The method of claim 1 wherein the substrate is in the form of a tape or continuous web.

11. The method of claim 1 wherein said metal composition is comprised of metal particles and a reactive organic medium, wherein said reactive organic medium is comprised of a decomposable compound or one or more reagents which form a decomposable compound with said metal particles.

12. The method of claim 11 wherein said decomposable compound in the reactive organic medium has a weak heteroatom bond to the metal such that it will decompose at a temperature which said temporary substrate can withstand.

13. The method of claim 12 wherein said heteroatom is selected from the group consisting of O, N, S, P, and As.

14. The method of claim 11 in which said metal particles are selected from the group consisting of the group IB, IIB, IVA, VA, VI A, VII A and VIIIA metals, manganese, indium, tin, antimony, lead and bismuth.

15. A method for producing one or more patterned metal objects on a substrate comprising the steps of:

a) applying a metal composition on a thermally resistant temporary substrate in the patterns of the one or more patterned metal objects;

b) curing said metal composition at a temperature below about 450° C. for a time less than about 30 minutes to form the one or more patterned metal objects;

c) transferring the one or more patterned metal objects from said temporary substrate to one side of the substrate without the use of a separately supplied adhesive;

d) applying a metal composition on a second thermally resistant substrate in the patterns of additional one or more patterned metal objects;

g) curing said metal composition at a temperature below about 450° C. for a time less than about 30 minutes to form said additional one or more patterned metal objects;

h) transferring said additional one or more patterned metal objects from said second temporary substrate to the side of the substrate opposite to which said one or more patterned metal objects were transferred in step c);

wherein step f) comprises placing a previously made double sided circuit and an additional substrate over said one or more patterned objects and then transferring said additional one or more patterned metal objects from said second temporary substrate to said substrate and previously made circuit to produce multiple layers;

wherein said metal composition is comprised of one or more metal powders in a reactive organic medium, said reactive organic medium consisting of one or more components selected from the group consisting of metallo-organic compounds which can decompose into elemental metal and volatile organic fragments, reagents which can react with said one or more metal powders to form metallo-organic compounds which can decompose into elemental metal and volatile organic fragments, and mixtures thereof.

\* \* \* \* \*